United States Patent
Myouga

(10) Patent No.: US 9,047,959 B1
(45) Date of Patent: Jun. 2, 2015

(54) DATA STORAGE DEVICE, MEMORY CONTROL METHOD, AND ELECTRONIC DEVICE WITH DATA STORAGE DEVICE

(71) Applicant: KABUSHIKI KAISHA TOSHIBA, Tokyo (JP)

(72) Inventor: Nobuyuki Myouga, Iruma (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 217 days.

(21) Appl. No.: 13/795,419

(22) Filed: Mar. 12, 2013

Related U.S. Application Data

(60) Provisional application No. 61/675,522, filed on Jul. 25, 2012.

(51) Int. Cl.
*G11C 7/00* (2006.01)
*G11C 16/10* (2006.01)

(52) U.S. Cl.
CPC ...................................... *G11C 16/10* (2013.01)

(58) Field of Classification Search
USPC ................ 365/230.08, 230.03, 189.05, 238.5
See application file for complete search history.

(56) References Cited

U.S. PATENT DOCUMENTS

| | | | |
|---|---|---|---|
| 6,904,400 B1 * | 6/2005 | Peri et al. | 703/28 |
| 2012/0221774 A1 * | 8/2012 | Atkisson et al. | 711/103 |
| 2012/0284587 A1 * | 11/2012 | Yu et al. | 714/773 |

\* cited by examiner

*Primary Examiner* — Tha-O H Bui
*Assistant Examiner* — Minh Dinh
(74) *Attorney, Agent, or Firm* — Oblon, McClelland, Maier & Neustadt, L.L.P.

(57) ABSTRACT

According to one embodiment, a data storage device comprises a buffer memory and a controller. The buffer memory stores a data group including sector unit data with addresses specified by a host, the data group in unit of page includes a plurality of addresses. The controller comprises an adding module configured to be operative, if the sector unit data with addresses specified by the host as valid addresses for write targets are stored in the buffer, to add information that identifies a last address included in valid addresses belonging to the same page addresses and specified by the host and starting with a start address, to a single sector unit data with the last address.

11 Claims, 11 Drawing Sheets

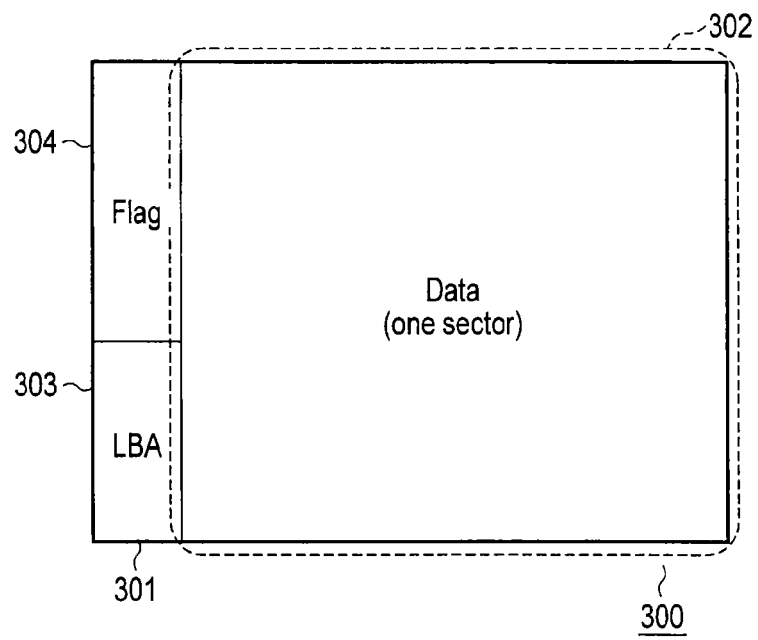
F I G. 3
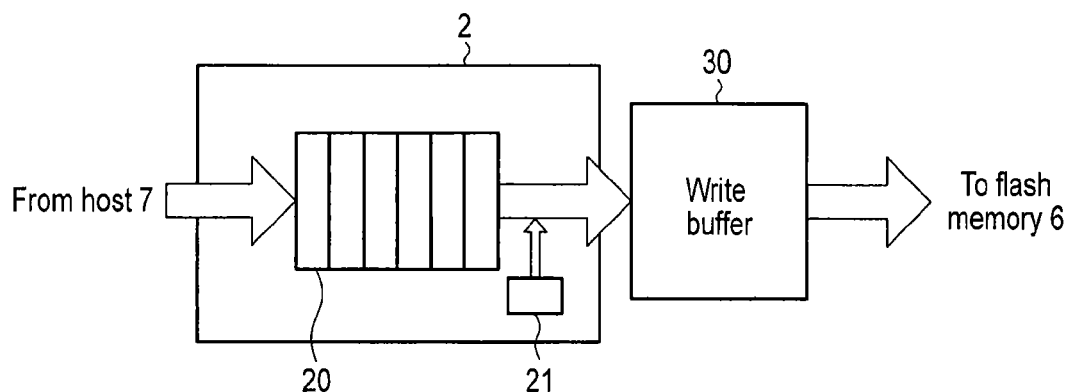
F I G. 4

FIG. 5A  Current LBA

FIG. 5B  Transfer timing for data for one sector

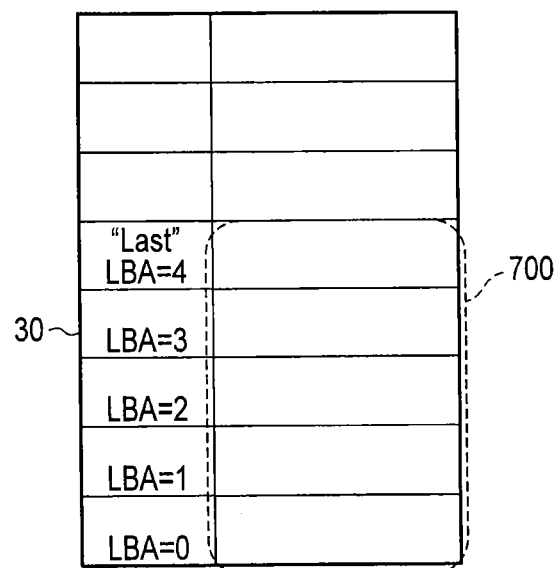
F I G. 7
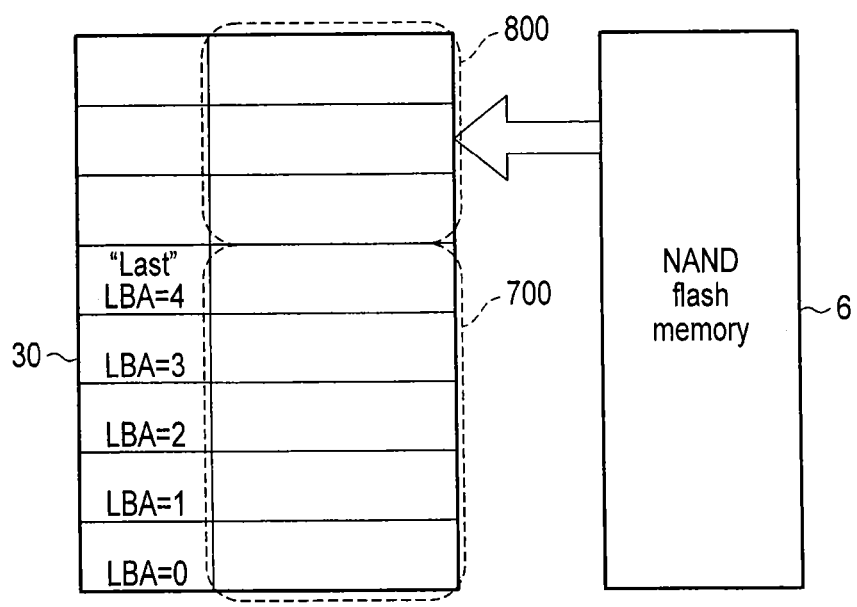
F I G. 8

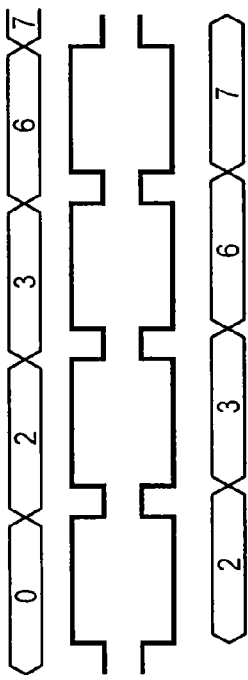
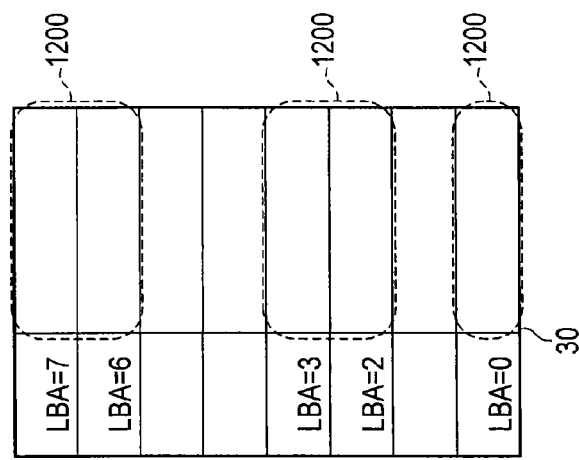
F I G. 11A　Current LBA
F I G. 11B　Transfer timing for data for one sector
F I G. 11C　Search of skip table
F I G. 11D　Next LBA
F I G. 12

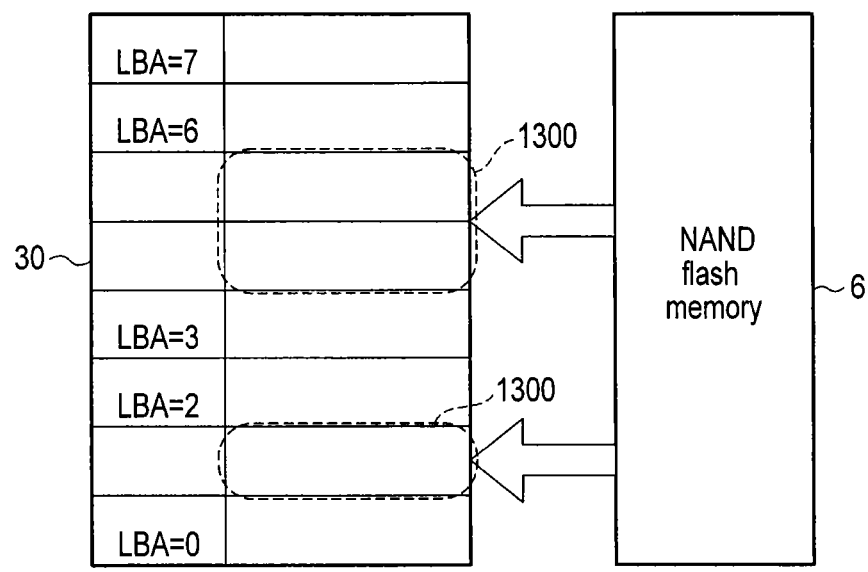
F I G. 13
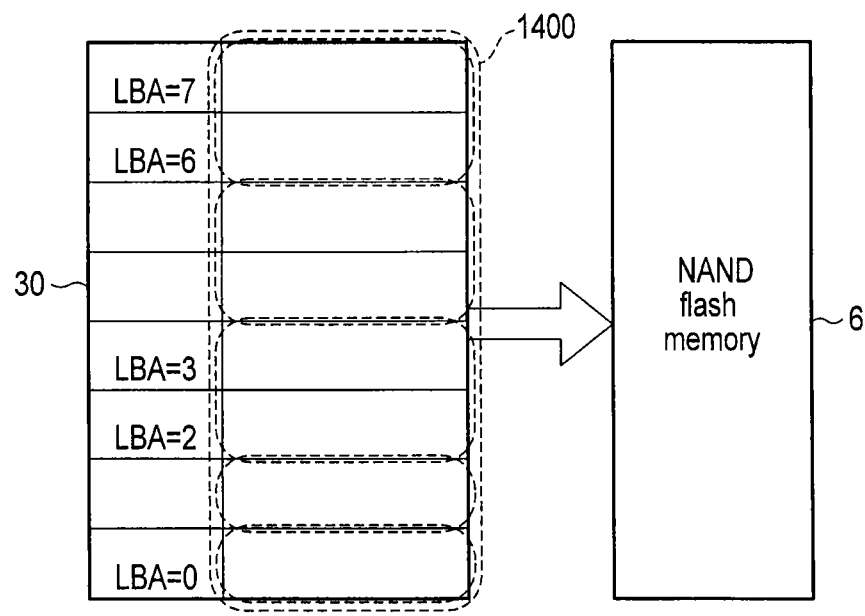
F I G. 14

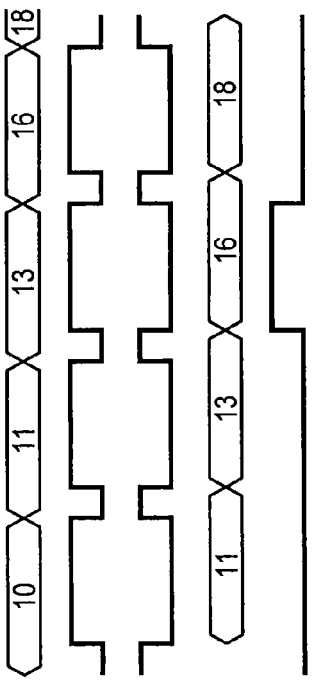
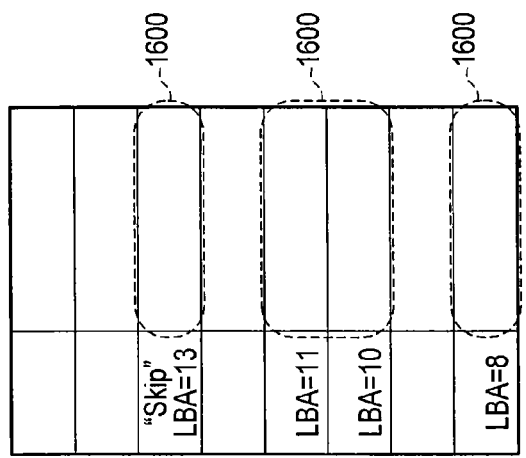
FIG. 15A  Current LBA
FIG. 15B  Transfer timing for data for one sector
FIG. 15C  Search of skip table
FIG. 15D  Next LBA
FIG. 15E  Skip flag
FIG. 16

DATA STORAGE DEVICE, MEMORY CONTROL METHOD, AND ELECTRONIC DEVICE WITH DATA STORAGE DEVICE

CROSS-REFERENCE TO RELATED APPLICATIONS

This application claims the benefit of U.S. Provisional Application No. 61/675,522, filed Jul. 25, 2012, the entire contents of which are incorporated herein by reference.

FIELD

Embodiments described herein relate generally to a data storage device using a nonvolatile memory, a memory control method, and an electronic device with the data storage device.

BACKGROUND

In recent years, every effort has been made to develop solid-state drives (SSDs) using, as a data storage device, a NAND flash memory (hereinafter simply referred to as a flash memory) that is a rewritable nonvolatile memory.

The SSD consecutively receives sector unit data from a host, prepares page unit data in a buffer, and then writes the page unit data to a flash memory. Each sector unit data is managed by a logical address referred to as a logical block address (LBA). Each page unit data is, for example, one cluster unit data comprising 8 sectors. The page is hereinafter referred to as the cluster.

The SSD involves a scheme for supporting a skip write command (SWC) from the host. The SWC is a command indicating a write of data only with valid LBAs (valid data). According to this scheme, valid LBAs are specified for the SSD using a skip table transferred together with the SWC from the host. That is, the SSD skips LBAs other than valid LBAs specified in the skip table, and stores data only with the valid LBAs in the buffer. The SSD stores the cluster unit data and then writes the data to a flash memory.

Here, the SSD may prepare cluster unit data in the buffer by combining new data only with valid LBAs from the host with old data read from the flash memory. That is, in the existing cluster unit data recorded in the flash memory, the new data specified as the valid LBAs are replaced. In this case, an efficient and reliable method is required for a process of arranging the data only with the valid LBAs into the buffer and writing the cluster unit data to the flash memory.

BRIEF DESCRIPTION OF THE DRAWINGS

FIG. 3 is a diagram illustrating a configuration of write data according to the embodiment;

FIG. 4 is a diagram illustrating a configuration of a buffer according to the embodiment;

FIGS. 5A and 5B are timing chart for explaining a write control process according to the embodiment;

FIG. 7 is a diagram for explaining the write control process according to the embodiment;

FIG. 8 is a diagram for explaining the write control process according to the embodiment;

FIGS. 11A, 11B, 11C, and 11D are timing charts for explaining write control using an SWC process according to the embodiment;

FIG. 12 is a diagram for explaining a write control process using the SWC process according to the embodiment;

FIG. 13 is a diagram for explaining the write control process using the SWC process according to the embodiment;

FIG. 14 is a diagram for explaining the write control process using the SWC process according to the embodiment;

FIGS. 15A, 15B, 15C, 15D, and 15E are timing charts for explaining a process of setting a skip flag according to the embodiment;

FIG. 16 is a diagram for explaining a write control process involved in the setting of the skip flag according to the embodiment;

DETAILED DESCRIPTION

In general, according to one embodiment, a data storage device comprises a buffer memory and a controller.

The buffer memory stores a data group including sector unit data with addresses specified by a host, the data group in unit of page comprising a plurality of addresses. The controller comprises an adding module configured to be operative, if the sector unit data with addresses specified by the host as valid addresses for write targets are stored in the buffer, to add information that identifies a last address included in valid addresses belonging to the same page addresses and specified by the host and starting with a start address, to a single sector unit data with the last address, a module configured to determine whether the single sector unit data with the last address with the information added thereto is stored in the buffer, and a module configured to perform, according to the determination, a control operation of storing the page unit data group belonging to the same page addresses in the buffer and then writing the page unit data group obtained from the buffer to a flash memory.

[Configuration of the Data Storage Device]

Figure 1:
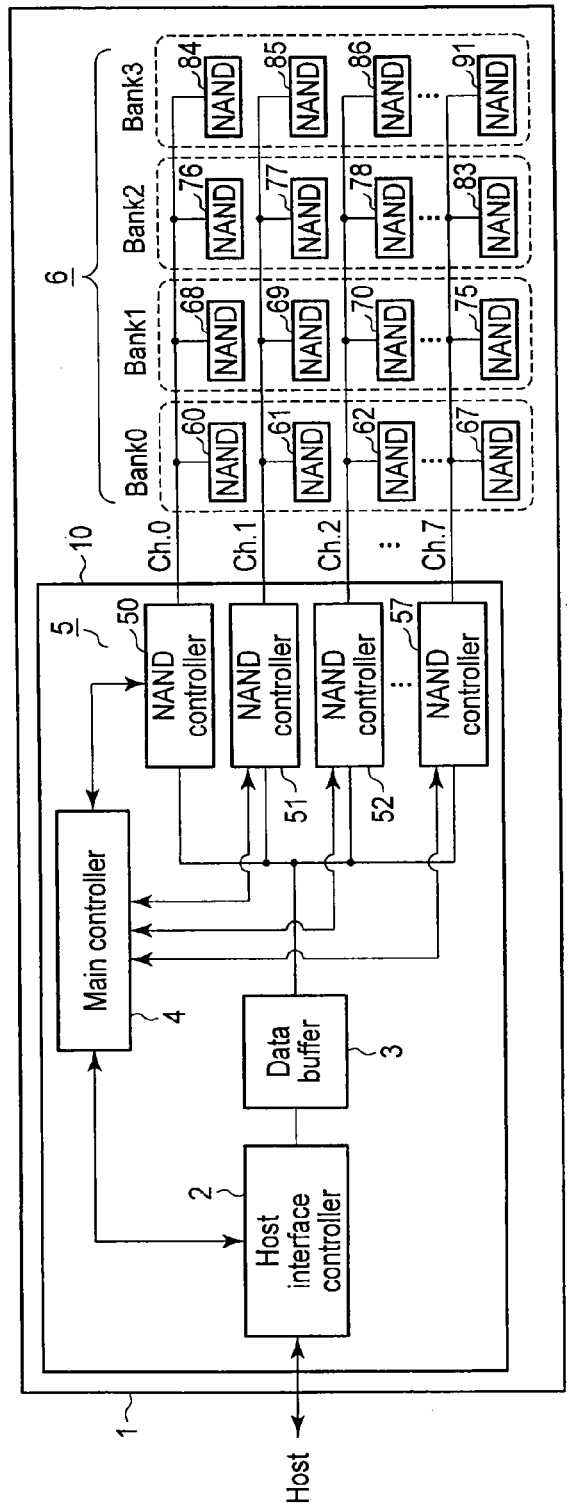
FIG. 1 is a block diagram illustrating a configuration of an SSD according to an embodiment.

As shown in FIG. 1, the data storage device according to the embodiment is an SSD (solid state drive) 1 comprising a NAND flash memory (hereinafter referred to as a flash memory) 6 as a data storage medium. The flash memory 6 comprises a plurality of memory chips 60 to 91 grouped in a matrix configuration comprising channels ch0 to ch7 corresponding to rows and banks 0 to 3 corresponding to columns. Each of the memory chips 60 to 91 comprises a plurality of physical blocks. The physical block is a minimum physical storage area unit that can be independently erased in the flash memory 6. The SSD 1 internally manages physical blocks as logical blocks. According to the present embodiment, the logical block may be simply referred to as a block.

Clusters are data units corresponding to pages. For example, one cluster comprises eight sectors. Here, the sector is a minimum access unit that is accessed by the host. Furthermore, each sector unit data is managed by a logical address referred to as a logical block address (LBA).

As shown in FIG. 1, the SSD 1 includes an SSD controller 10 that controls the flash memory 6. The SSD controller 10 comprises a host interface controller 2, a data buffer 3, a main controller 4, and a memory controller 5.

The host interface controller 2 controls the transfer of data and commands between the host and the SSD 1. Each of the commands includes a skip table. Here, the host is, for example, a computer with an interface conforming to the Serial ATA (SATA) standard or the Serial Attached SCSI (SAS) standard. The host interface controller 2 stores data transferred by the host (write data) in the data buffer 3. Furthermore, the host interface controller 2 transfers a command transferred by the host (and including a skip table) to the main controller 4.

According to the present embodiment, the data buffer 3 is memory comprising a static random access memory (SRAM). The data buffer 3 may adopt any other type of volatile random access memory such as a dynamic random access memory (DRAM). Furthermore, the data buffer 3 may adopt any other type of nonvolatile random access memory such as a magnetoresistive random access memory (MRAM) or a ferroelectric random access memory (FeRAM).

The main controller 4 comprises, for example, a microprocessor (MPU) and performs main control of the SSD controller 10. The main controller 4 integrally controls NAND controls 50 to 57 and thus data read/write operations that are performed on the flash memory 6. The memory controller 5 comprises the plurality of NAND controllers 50 to 57 for the respective channels ch0 to ch7, and carries out a read process or a write process on the flash memory 6 in accordance with a command from the main controller 4. Each of the NAND controllers 50 to 57 performs a parallel operation of carrying out a read process or a write process on those of the memory chips 60 to 91 on the corresponding one of channels ch0 to ch7 and carrying out a bank interleave operation on the memory chips 60 to 91 using the four banks.

Figure 2:
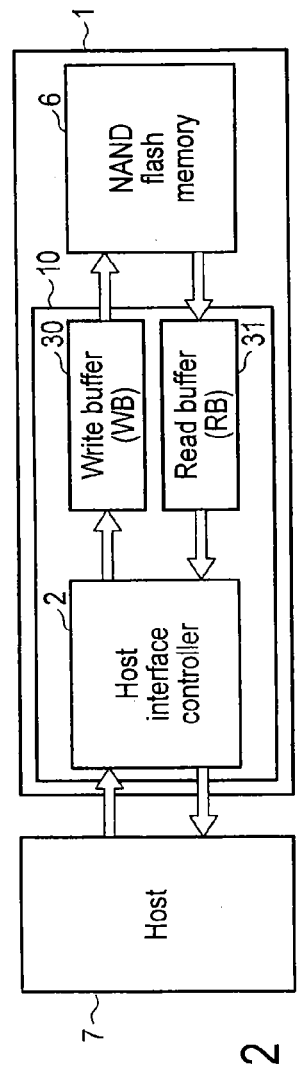
FIG. 2 is a block diagram illustrating a configuration of an SSD controller according to the embodiment.

FIG. 2 is a block diagram showing an essential part of the SSD controller 10 according to the present embodiment.

As shown in FIG. 2, the SSD controller 10 comprises a host interface controller 2 and a data buffer 3. For an increased data transfer rate, the data buffer 3 according to the present embodiment comprises a memory with high-speed data transfer which is composed of a SRAM. The data buffer 3 roughly comprises a write buffer (WB) 30 that stores write data and a read buffer (RB) 31 that stores read data. According to the present embodiment, the write buffer 30 is sometimes referred to as a buffer.

The host interface controller 2 receives and arranges data transferred by the host 7 (write data) into the buffer (write buffer) 30 in accordance with the respective LBAs. The SSA controller 10 allows the main controller 4 and the memory controller 5 to write data from the buffer 30 to the flash memory 6 in units of clusters.

As shown in FIG. 3, according to the present embodiment, a single data 300 stored in the buffer 30 comprises data 302 each corresponding to a sector and a header 301 added to the data 302. The data 300 as a data unit is sometimes referred to as a data packet. The header 301 comprises, for example, 16 bytes, and includes an LBA 303 and any of various flags 304. The LBA 303 is, for example, a logical address for the data 302 which comprises 6 bytes (48 bits). The flag 304 comprises, for example, 10 bytes, and is a last flag or a skip flag which will be described below.

As shown in FIG. 4, the host interface controller 2 comprises a receive buffer 20 configured to receive data transferred by the host 7. The receive buffer 20 has a first-in first-out (FIFO) configuration and is sometimes referred to as a receive FIFO 20. The receive buffer 20 consecutively receives 1,024-byte data in the case of, for example, a Serial Attached SCSI (SAS) interface. In this case, according to the standard for the SAS interface, once started, reception cannot be stopped until completed.

Moreover, the host interface controller 2 comprises a header addition module 21. The header addition module 21 adds the header 301 to every sector unit data 302 output by the receive FIFO 20 to generate a data packet 300. Here, the sector unit data 302 comprises, for example, 512 bytes. The host interface controller 2 sequentially transfers data packets 300 to the buffer 30, and stores data packets for one cluster (here, for eight sectors) in the buffer 30.

[Write Control Operation]

First, with reference to FIG. 5A, FIG. 5B, and FIGS. 6 to 9, a basic operation of write control performed by the SSD controller 10 according to the present embodiment.

The host interface controller 2 receives write commands and data transferred by the host 7 and stores the data in the receive FIFO 20. Moreover, every time the host interface controller 2 outputs and transfers one sector unit data from the receive FIFO 20 to the buffer 30, the host interface controller 2 allows the header addition module 21 to add an LBA to the header. The LBA added to the header is hereinafter referred to as a current LBA.

The header addition module 21 increments a start LBA (for example, 0) specified by a write command from the host 7 every time the header addition module 21 transfers data packets for one sector to the buffer 30. That is, as shown in FIG. 5A, the current LBA (1, 2, 3, . . . ) obtained by sequentially incrementing the start current LBA (0) is added to each header. Thus, as shown in FIG. 5B, data packets for one sector each having the current LBA added to the header thereof are stored in the buffer 30.

Figure 6:
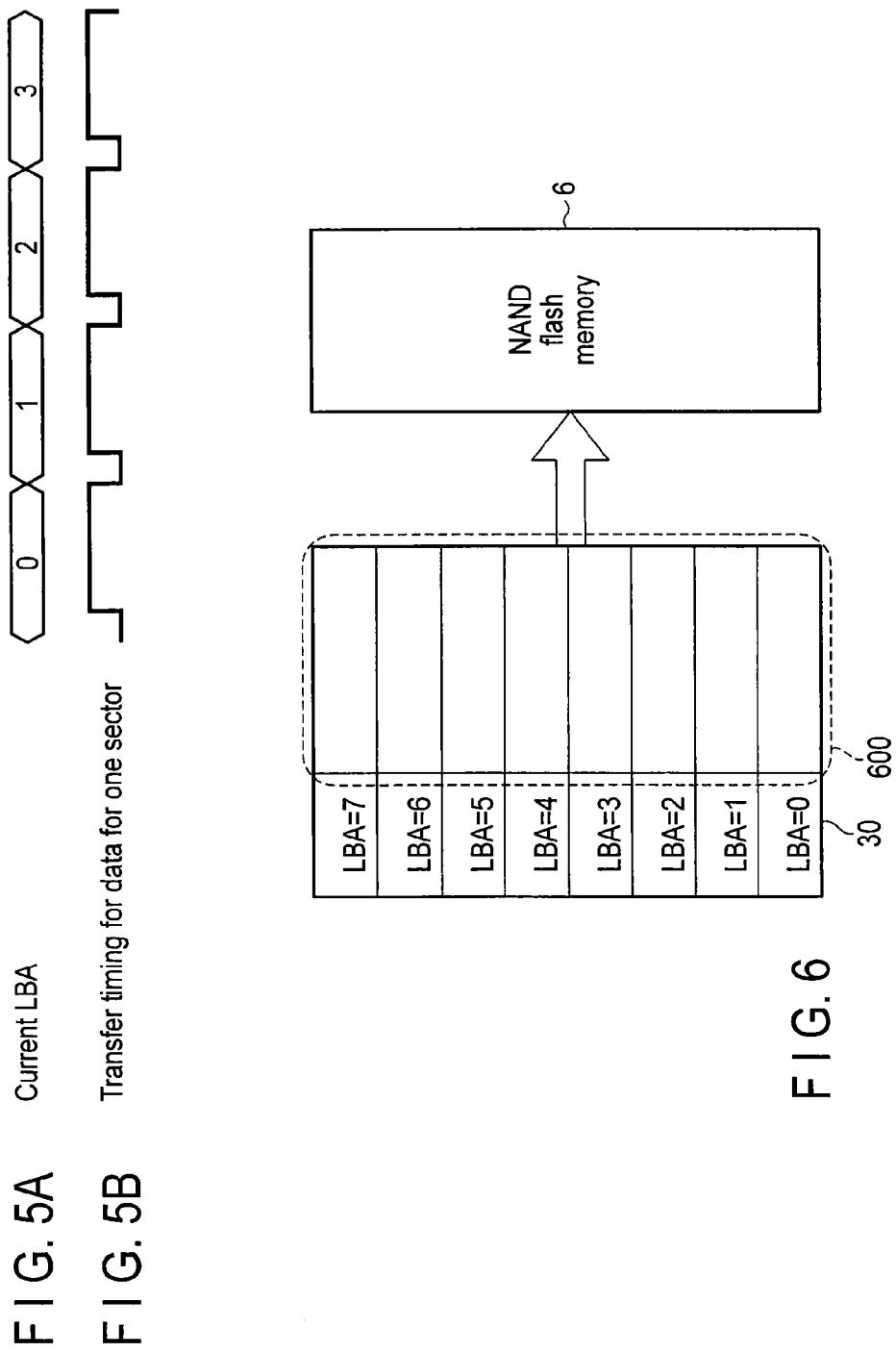
FIG. 6 is a diagram for explaining a write control process of controlling write of cluster unit data according to the embodiment.

As shown in FIG. 6, when the data for one cluster are stored in the buffer 30, the SSD controller 10 starts a control operation of writing the data obtained from the buffer 30 to the flash memory 6. The data for one sector are, for example, 4,096-byte data contained in data packets for eight sectors. Based on a notification from the host interface controller 2, the SSD controller 10 detects the lower 3 bits of the current LBA added to the header and determines that data for one cluster have been stored in the buffer 30 when the value of the lower 3 bits is 7.

Even if the data received in one write command transferred by the host 7 does not correspond to one cluster, the host interface controller 2 adds a last flag indicative of "last" to the header of the last LBA of the data. That is, as shown in FIG. 7, if the header addition module 21 receives data for five sectors (hereinafter referred to as new data) from the host 7, the header addition module 21 adds the last flag to the header corresponding to the last LBA (the lower 3 bits of the last LBA are assumed to have a value of 4).

Based on a notification from the host interface controller 2, the SSD controller 10 starts a control operation of writing the data from the buffer 30 to the flash memory 6 if a current LBA with the last flag added thereto is present, even though no current LBA with the lower 3 bits having a value of 7 is present. In this case, as shown in FIG. 8, the SSD controller 10 reads, from the flash memory 6, old data 800 in sectors (here, three sectors) which belong to the same cluster (with the same cluster address or the same page addresses) as that of the received new data 700, and stores the old data 800 in the buffer 30.

Figure 9:
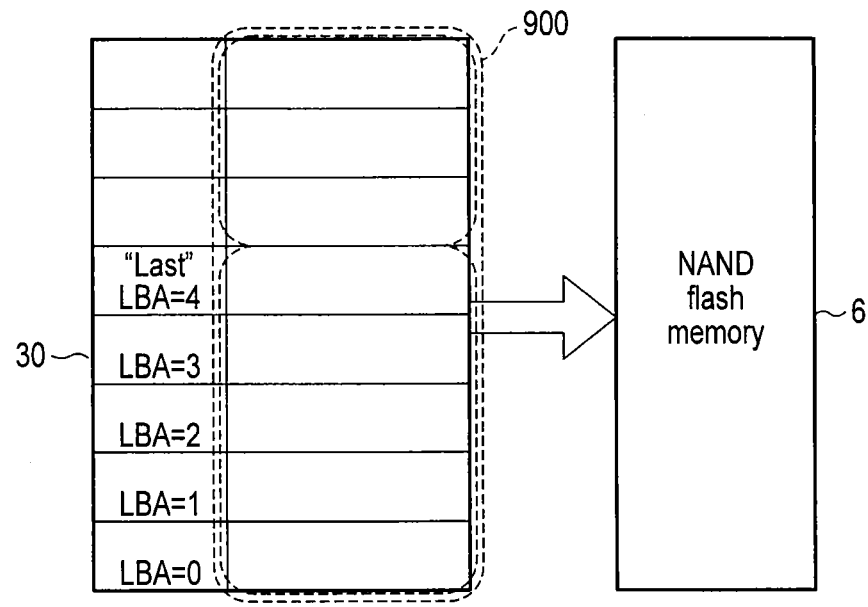
FIG. 9 is a diagram for explaining the write control process according to the embodiment.

That is, in this cluster, the new data 700 are rewrite data for the corresponding LBAs, and the old data 800 are maintained without any change. As shown in FIG. 9, the SSD controller 10 performs a control operation of writing data 900 for one cluster corresponding to a combination of the new data 700 and old data 800 obtained from the buffer 30, to the flash memory 6.

Now, with reference to FIGS. 10 to 19, a write control operation performed by the SSD controller 10 and involving an SWC process according to the present embodiment will described.

The SWC process is carried out in, accordance with a skip write command (SWC) and comprises receiving a write command including a skip table that specifies valid LBAs for a write request (rewrite request) from the host and storing data only with the valid LBAs in the buffer 30.

Figure 10:
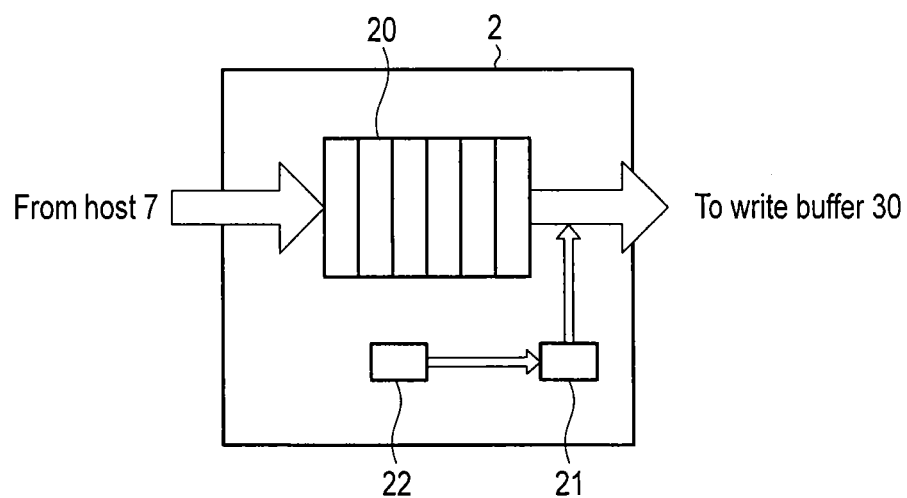
FIG. 10 is a block diagram illustrating an essential part of a host interface controller according to the embodiment.

According to the present embodiment, as shown in FIG. 10, the host interface controller 2 comprises a memory 22 to which skip tables transferred in SWCs by the host 7 are saved. In the skip table, information specifying valid LBAs transferred by the host 7 is set. The host interface controller 2 references the skip table to determine a valid LBA for the write request and updates the current LBA of the header.

Specifically, before transferring data for one sector from the receive FIFO 20 to the buffer 30, the header addition module 21 references the skip table in the memory 22 to determine the next valid LBA (hereinafter referred to as the next LBA).

As shown in FIG. 11A, the header addition module 21 adds the start current LBA (0) to the header of the data packet for one sector. As shown in FIG. 11B, the host interface controller 2 transfers the data packet for one sector with the current LBA (0) added to the header thereof, to the buffer 30.

Then, as shown in FIGS. 11C and 11D, the header addition module 21 references the skip table to determine the next LBA (2). If the transfer of the data packet with the current LBA (0) is finished, the header addition module 21 copies the next LBA (2) to the header of the next data packet for one sector as a current LBA.

As shown in FIG. 12, the above-described SWC process allows data (new data) 1200 comprising valid current LBAs (0, 2, 3, 6, and 7) for five sectors to be stored in the buffer 30. As is the case of a normal process that does not carry out the SWC process (that is, the normal process does not carry out skipping), the SSD controller 10 starts a control operation of writing the data obtained from the buffer 30 to the flash memory 6 if a current LBA with the lower 3 bits having a value of 7 is present or if the last flag is added to the data.

Here, as shown in FIG. 13, the SSD controller 10 reads, from the flash memory 6, old data 1300 in sectors (here, three sectors) with skipped LBAs (1, 4, and 5) which belong to the same cluster as that of the received new data 1200, and stores the old data 1300 in the buffer 30.

That is, in this cluster, the new data 1200 are rewrite data for the corresponding LBAs, and the old data 1300 are maintained without any change. As shown in FIG. 14, the SSD controller 10 performs a control operation of writing data 1400 for one cluster corresponding to a combination of the new data 1200 and old data 1300 obtained from the buffer 30, to the flash memory 6.

In the above-described write control process with the SWC process, if the current LBA with the lower 3 bits having a value of 7 is skipped and no current LBA with the last flag added thereto is present, the SSD controller 10 may miss a timing to write data from the buffer 30 to the flash memory 6. Thus, to deal with this, the present embodiment carries out a process of detecting the last LBA belonging to a write target cluster and adding a skip flag to the header of the last LBA. The process will be specifically described below with main reference to a flowchart in FIG. 19.

The host interface controller 2 receives a write command and data transferred by the host 7 and stores the data in the receive FIFO 20 (block 100). The host interface controller 2 determines the current LBA added to the header of each data packet and the number of data packets (the number of sectors transferred) (block 101).

Here, if the host 7 does not issue a skip write command or carry out an SWC process, the SSD controller 10 executes a normal write control process (NO in block 102). That is, the host interface controller 2 allows the receive FIFO 20 to output one sector unit data, adds the current LBA to the header of the data, and transfers the resulting data to the buffer 30 (NO in block 105, NO in block 109, and block 111).

Every time the host interface controller 2 transfers a data packet for one sector to the buffer 30, the host interface controller 2 increments the current LBA of the header of the data packet (block 112). Here, upon determining that the LBA is the last based on the number of sectors transferred, the host interface controller 2 adds the last flag to the last current LBA (YES in block 105 and block 106). In this case, the process is not skip write, and thus the LBAs of the data transferred by the host 7 are consecutive. Hence, the last LBA can be determined based on the number of sectors transferred. Furthermore, if the lower 3 bits have a value of 7, the host interface controller 2 determines, that data for one sector has been stored in the buffer 30, and notifies the SSD controller 10.

Upon transferring the data packet with the last current LBA to the buffer 30, the host interface controller 2 waits until the next data is transferred by the host 7 and stored in the receive FIFO 20 (block 108). In the next process, when data for one sector is stored in the buffer 30, the SSD controller 10 performs a control operation of writing the data from the buffer 30 to the flash memory 6.

On the other hand, when the host 7 issues a skip write command, the SSD controller 10 carries out a write control process with an SWC process (YES in block 102). That is, as shown in FIG. 15A, the current LBAs are not consecutive but some of the current LBAs are skipped. Here, as shown in FIG. 16, the host 7 transfers, for example, data (new data) 1600 comprising the current LBAs (8, 10, 11, and 13) for four sectors.

As shown in FIGS. 15C and 15D, the header addition module 21 references the skip table to determine the next LBA (for example, 11) (block 103). As shown in FIGS. 15B and 15D, once the transfer of the data packet with the current LBA (10) is finished, the header addition module 21 copies the next LBA (11) to the header of the next data packet for one sector as a current LBA (NO in block 105, NO in block 109, blocks 111 and 112).

Here, the skip write involves skipped LBAs, resulting in inconsecutive LBAs. Thus, when the referenced ski table indicates that an LBA with the lower 3 bits having a value of 7 is skipped, the last LBA cannot be determined. Thus, the header addition module 21 according to the present embodiment compares the current LBA with the last LBA to determine whether or not both LBAs belong to the same cluster. Specifically, the header addition module 21 determines that the two LBAs, each of which comprises 48 bits, belong to the same cluster if the upper 45 bits of one LBA are equal to the upper 45 bits of the other LBA. The header addition module 21 determines that the two LBAs do not belong to the same cluster if the upper 45 bits of one LBA are not equal to the upper 45 bits of the other LBA. One cluster comprises, for example, data for eight sectors with consecutive LBAs.

As shown in FIG. 15E, upon comparing the current LBA (for example, 13) with the next LBA (for example, 16) to determine that the two LBAs do not belong to the same cluster, the header addition module 21 generates a skip flag (block 104). Moreover, the header addition module 21 adds the skip flag to the header with the current LBA (for example, 13) (NO in block 105, YES in block 109, and 110).

As described above, the data packet with the current LBA added to the header of one sector unit data is obtained from the receive FIFO 20 and stored in the buffer 30. In the SWC process, every time a data packet for one sector is transferred, the next LBA is copied to the header of the next data packet as a current LBA.

According to the present embodiment, as shown in FIG. 16, for example, data (new data) 1600 comprising valid current LBAs (8, 10, 11, and 13) for four sectors are stored in the buffer 30. The skip flag is added to the header of the data packet of the last current LBA (13), included in the valid current LBAs belonging to the same cluster. The SSD controller 10 starts a control operation of writing the data from the buffer 30 to the flash memory 6.

Figure 17:
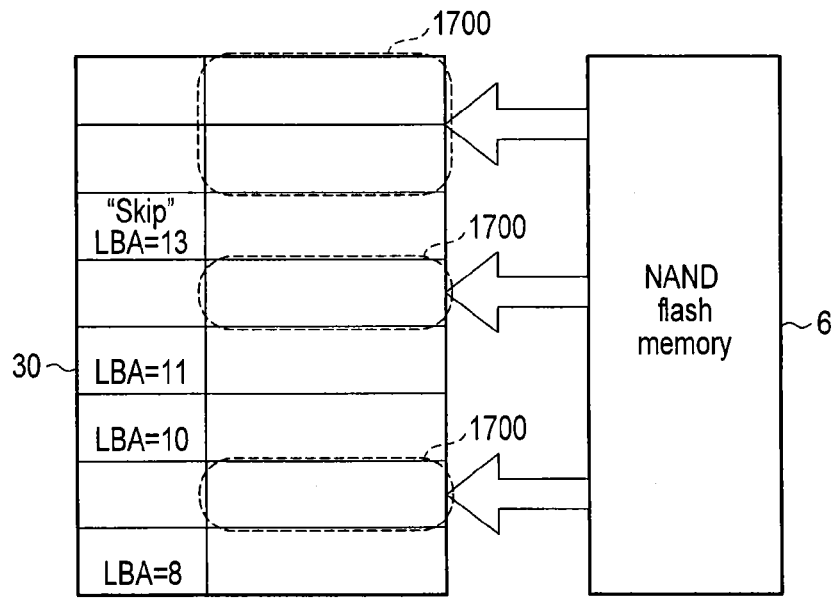
FIG. 17 is a diagram for explaining the write control process in the setting of the skip flag according to the embodiment.
Figure 18:
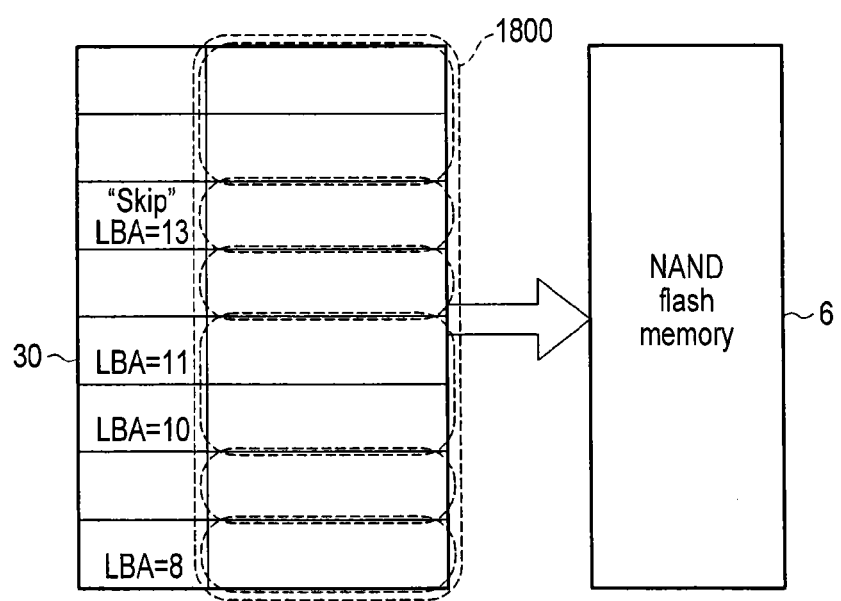
FIG. 18 is a diagram for explaining the write control process in the setting of the skip flag according to the embodiment.
Figure 19:
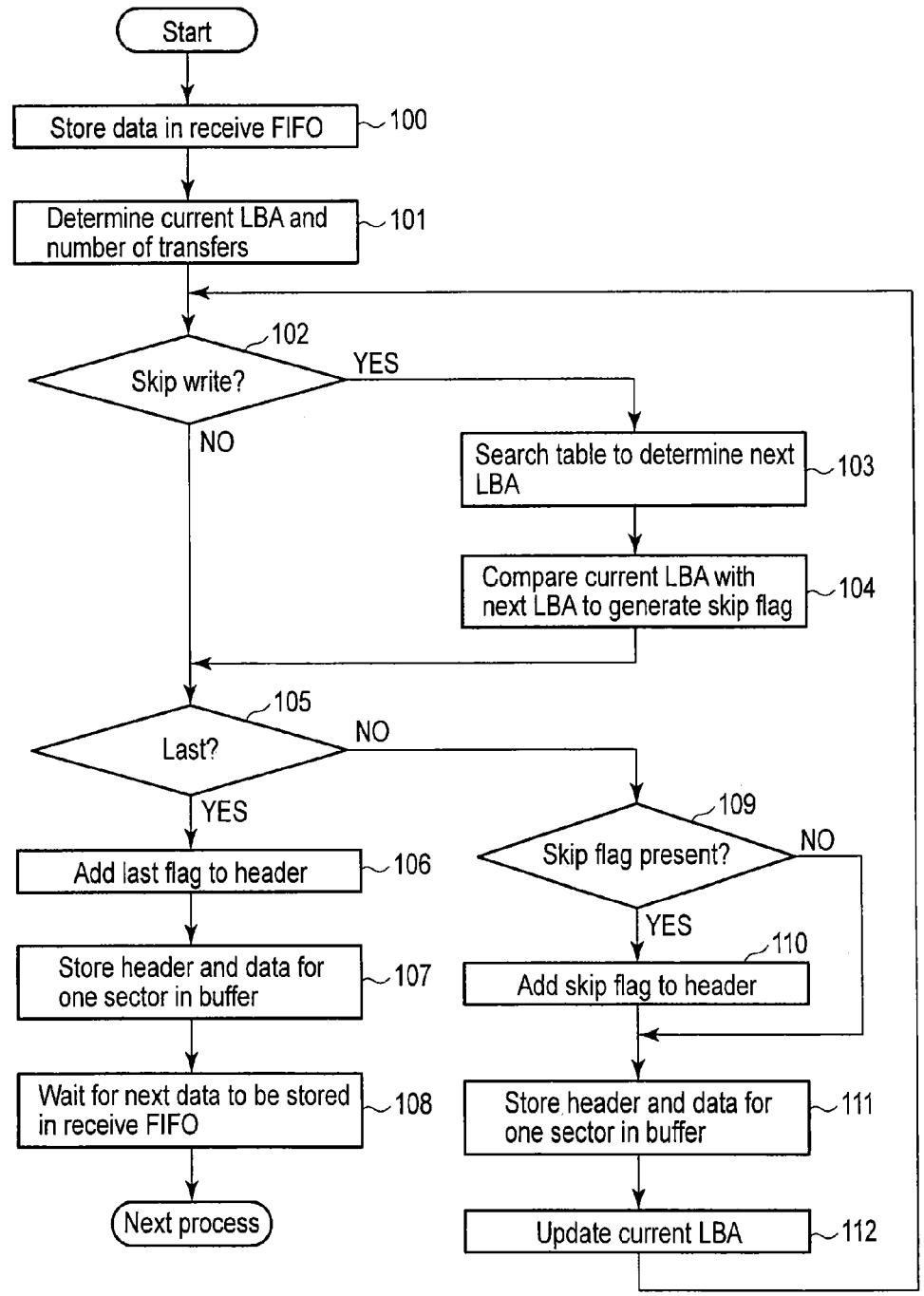
FIG. 19 is a flowchart for explaining a write control operation according to the embodiment.

Here, as shown in FIG. 17, the SSD controller 17 reads old data 1700 in sectors (here, four sectors) with the skipped LBAs (9, 12, 14, and 15) belonging to the same cluster as that of the received new data 1600, and stores the data in the buffer 30. That is, in this cluster, the new data 1600 are rewrite data for the corresponding LBAs, and the new data 1700 are maintained without any change. As shown in FIG. 18, the SSD controller 10 performs a control operation of writing data 1800 for one cluster corresponding to a combination of the new data 1600 and old data 1700 obtained from the buffer 30, to the flash memory 6.

Thus, in the write control process with the SWC process according to the present embodiment, the last current LBA can be determined even if the LBA with the lower 3 bits having a value of 7, which LBA is included in the valid current LBAs stored in the buffer 30 and belonging to the same cluster, is skipped. Furthermore, the last current LBA can be similarly determined even if the last flag is not added. The present embodiment can thus achieve a control operation of reliably writing data for one cluster belonging to the same cluster stored in the buffer 30, to the flash memory 6.

Figure 20:
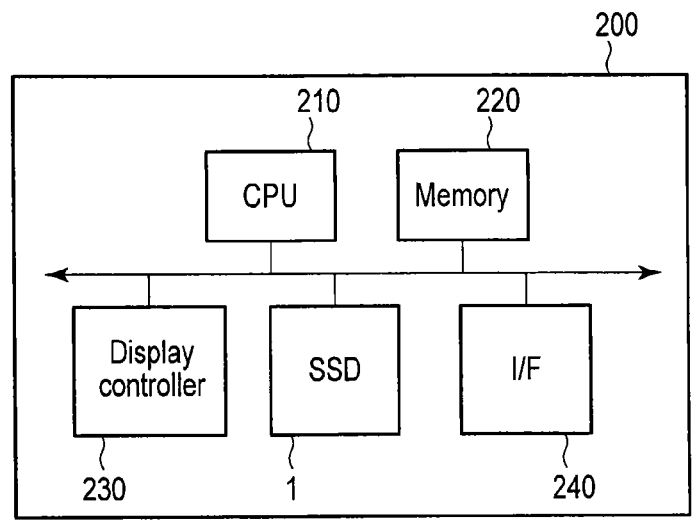
FIG. 20 is a block diagram illustrating a configuration of an electronic device according to the embodiment.

FIG. 20 is a diagram showing an essential part of an electronic device 200 with the SSD 1 according to the present embodiment. As shown in FIG. 20, the electronic device 200 is, for example, a personal computer and comprises a CPU 210, a memory 220, a display controller 230, and an interface (I/F) 240. The electronic device 200 uses the SSD 1 according to the present embodiment as a storage device such as a file retention device. The SSD 1 carries out the above-described write control process with the SWC process in accordance with a command from the CPU 210 serving as a host.

Figure 21:
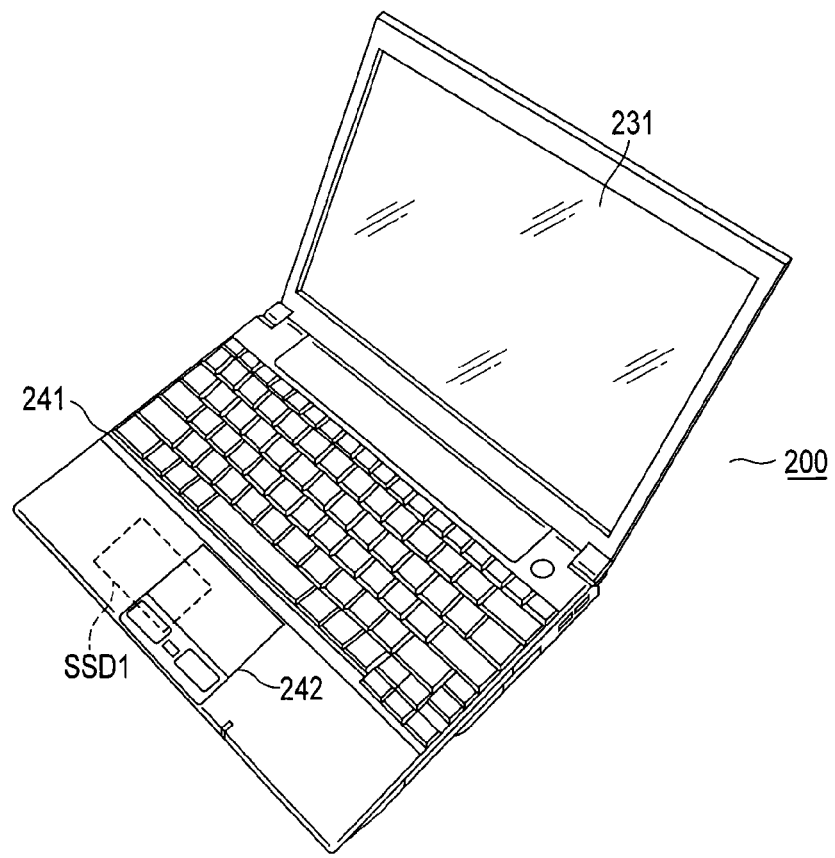
FIG. 21 is a diagram showing the appearance of a personal computer that is an example of the electronic device according to the embodiment.

FIG. 21 is a diagram showing the appearance of a personal computer as an example of the electronic device 200. The personal computer 200 comprises a main body incorporating the SSD 1 according to the present embodiment. A display 231 is subjected to display control by a display controller 230. Furthermore, a keyboard 241 and a touch pad 242 serving as input devices are each configured to input commands or data to the CPU 210 incorporated in the main body via an interface (I/F).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage device comprising:
    a buffer memory configured to store a data group including sector unit data with addresses specified by a host, the data group being in units of pages each comprising a plurality of addresses; and
    a controller configured to perform a control operation of writing the page unit data group obtained from the buffer memory to a flash memory,
    wherein the controller comprises:
    an adding module configured to be operative, if the sector unit data with addresses specified by the host as valid addresses for write targets are stored in the buffer memory, to add information that identifies a last address included in valid addresses belonging to the identical-page addresses and specified by the host and starting with a start address, to a single sector unit data with the last address;
    a module configured to determine whether the single sector unit data with the last address with the information added thereto is stored in the buffer memory; and
    a module configured to perform, according to the determination, a control operation of storing the page unit data group belonging to the identical-page addresses in the buffer memory and then writing the page unit data group obtained from the buffer memory to the flash memory.

2. The data storage device of claim 1, wherein the controller comprises a receive buffer memory configured to sequentially receive and store the sector unit data transferred by the host, and
    if a operation of transferring sector unit data from the receive buffer data to the buffer memory is performed, the adding module adds the information to the transferred data.

3. The data storage device of claim 1, wherein the controller is configured to store the data from the host belonging to the identical-page address and the data read from the flush memory in the buffer to arrange the page unit data group belonging to the identical-page addresses into the buffer.

4. The data storage device of claim 1, wherein the adding module is configured:
    to set first flag information to be the information, and
    to be operative, if the sector unit data transferred by the host is stored in the buffer, to add second flag information that identifies, based on a number of sector unit data transferred by the host, a last address included in valid addresses belonging to the identical-page addresses and specified by the host and starting with a start address, to a single sector unit data with the last address.

5. The data storage device of claim 1, wherein the adding module is configured:
    to be operative, when the sector units data with the specified addresses are stored in the buffer, to compare a first address stored first with a second address stored after the first address, and if the first and second addresses are not addresses belonging to the identical-page, to determine that the first address to be a last address belonging to the identical-page addresses, and to add the information that identifies the determined last address.

6. The data storage device of claim 1, wherein the controller is configured:
to define new data to be sector unit data with addresses specified by the host as valid addresses for write targets and store the new data for respective addresses in the buffer,
to define old data to be sector unit data with addresses not specified as the valid addresses but belonging to the identical-page addresses,
to read the old data from the flash memory if the new data with the last address is stored in the buffer based on the information, the old data and the new data belonging to the identical-page addresses, and
to arrange a second data unit group comprising the new data and the old data into the buffer.

7. The data storage device of claim 1, wherein the adding module is configured to add skip flag information to a single sector unit data with the last address if the adding module receives a skip write command from the host.

8. An electronic device with the data storage device according to claim 1, comprising:
a controller configured to transfer sector unit data with valid addresses for rewrite targets in a page unit data group belonging to identical-page addresses, to the data storage device, and to write the page unit data group including the sector unit data to a flash memory.

9. A memory control method applied to a data storage device comprising a buffer configured to store a data group including sector unit data with addresses specified by a host, the data group being in units of pages each comprising a plurality of addresses, and a controller configured to perform a control operation of writing the page unit data group obtained from the buffer to a flash memory, the method control method comprising:
if the sector unit data with addresses specified by the host as valid addresses for write targets are stored in the buffer, adding information that identifies a last address included in valid addresses belonging to the identical-page addresses and specified by the host and starting with a start address, to a single sector unit data with the last address;
determining whether the single sector unit data with the last address with the information added thereto is stored in the buffer; and
according to the determination, performing a control operation of storing the page unit data group belonging to the identical-page addresses in the buffer and then writing the page unit data group obtained from the buffer to the flash memory.

10. The memory control method of claim 9, wherein the data from the host belonging to the identical-page address and the data read from the flush memory are stored in the buffer to arrange the page unit data group belonging to the identical-page addresses into the buffer.

11. A data storage device comprising:
a buffer configured to store a data group including sector unit data with addresses specified by a host, the data group being in units of pages each comprising a plurality of addresses; and
a controller configured to store sector unit data for addresses specified by the host as valid addresses for write targets and belonging to identical-page addresses, and then to arrange the page unit data group belonging to the identical-page addresses into the buffer to write the page unit data group obtained from the buffer to a flash memory.

* * * * *